US007729180B2

(12) United States Patent
Hirabayashi

(10) Patent No.: US 7,729,180 B2
(45) Date of Patent: Jun. 1, 2010

(54) SEMICONDUCTOR MEMORY DEVICE

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 238 days.

(21) Appl. No.: 11/956,009

(22) Filed: Dec. 13, 2007

(65) Prior Publication Data

US 2008/0144402 A1 Jun. 19, 2008

(30) Foreign Application Priority Data

Dec. 15, 2006 (JP) .............................. 2006-338717

(51) Int. Cl.
*G11C 7/00* (2006.01)
(52) U.S. Cl. ............... 365/189.11; 365/226; 365/230.01
(58) Field of Classification Search ............ 365/189.11, 365/226, 230.01
See application file for complete search history.

(56) References Cited

U.S. PATENT DOCUMENTS

2002/0163841 A1* 11/2002 Taura et al. ............ 365/189.11
2003/0098711 A1* 5/2003 Tsuboi et al. ................. 326/81
2007/0036017 A1* 2/2007 Seo ............................ 365/222

OTHER PUBLICATIONS

Muhammad Khellah, et al., "A 4.2GHz 0.3mm² 256kb Dual-$V_{cc}$ SRAM Building Block in 65nm CMOS", 2006 IEEE International Solid-State Circuits Conference (ISSCC 2006), Digest of Technical Papers, Session 34, SRAM, 34.2, Feb. 8, 2006, 10 Pages.

* cited by examiner

*Primary Examiner*—Thong Q Le
(74) *Attorney, Agent, or Firm*—Oblon, Spivak, McClelland, Maier & Neustadt, L.L.P.

(57) ABSTRACT

A semiconductor memory device operates using a first power supply and a second power supply. The device includes a static memory cell which receives the first power supply, a word line which is connected to the memory cell, and a decoder which controls selection/deselection of the word line on the basis of an address signal having a voltage of the second power supply. The decoder includes a level shifter which changes a voltage of the word line to a voltage of the first power supply, and a switching circuit which receives the first power supply and applies a voltage lower than the first power supply to the level shifter in selecting the word line.

18 Claims, 5 Drawing Sheets

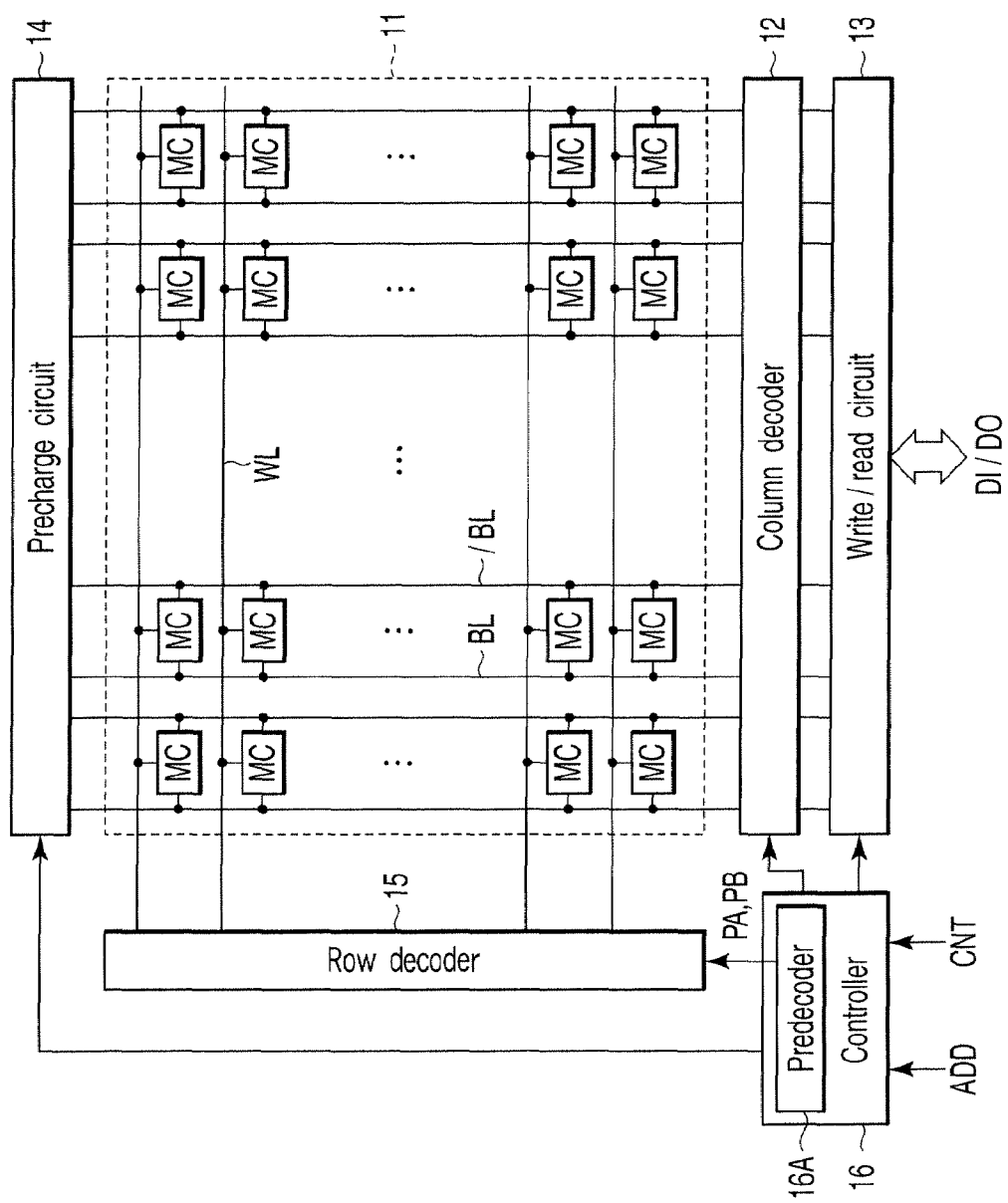
F I G. 1

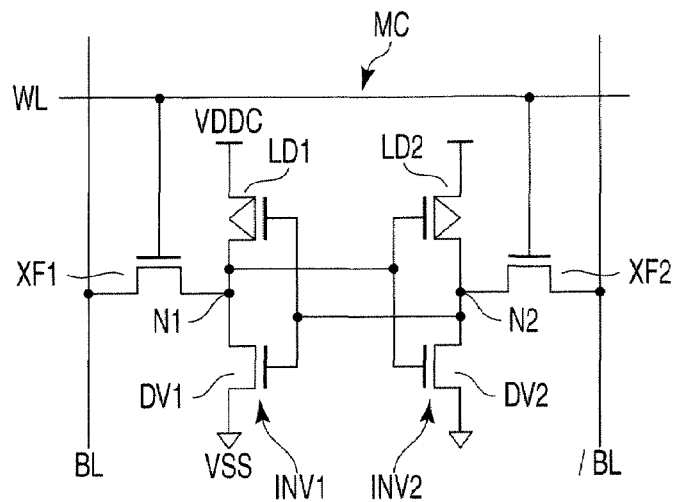
F I G. 2
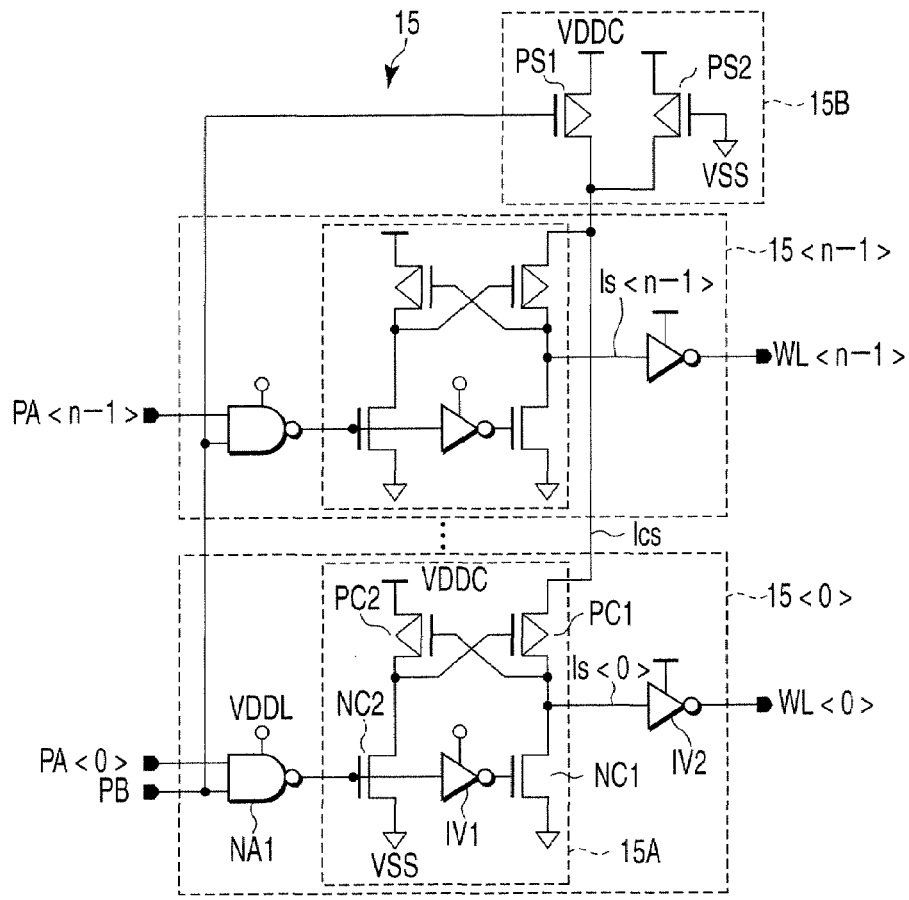
F I G. 3

SEMICONDUCTOR MEMORY DEVICE

CROSS-REFERENCE TO RELATED APPLICATIONS

This application is based upon and claims the benefit of priority from prior Japanese Patent Application No. 2006-338717, filed Dec. 15, 2006, the entire contents of which are incorporated herein by reference.

BACKGROUND OF THE INVENTION

1. Field of the Invention

The present invention relates to a semiconductor memory device and, for example, a semiconductor memory device having, e.g., static memory cells.

2. Description of the Related Art

Along with the advance in the micropatterning technology for semiconductor elements and the improvement of the performance of large-scale integrated circuits (LSIs), high power consumption is becoming a serious problem for recent LSIs. To solve this problem, a technique of dynamically controlling the operating frequency and power supply voltage in accordance with the load of a process is employed. More specifically, in a low-load process, the power consumption is suppressed by reducing the power supply voltage and operating frequency. To reduce the power consumption of an LSI by such control, it is important to minimize the operating voltage in a low-load mode.

However, in a static random access memory (SRAM) that is often used as a semiconductor memory in an LSI, the voltage margin of a memory cell decreases to make it difficult to execute a low-voltage operation as the device scaling progresses. For this reason, an SRAM employs a technique of reducing only the voltage of logic circuit portions without reducing the voltage of the memory cell portion in the LSI. Such an LSI is described in, e.g., Muhammad Khellah et al., "A 4.2-GHz 0.3-mm² 256-Kb Dual-Vcc SRAM Building Block in 65-nm CMOS", ISSCC Digest of Technical Papers, 2006, pp. 624-625.

In this SRAM, memory cells and word lines connected to them always use a high power supply voltage. Other logic circuit portions, however, use a low voltage when the process load is light. Since a potential difference is produced between the logic power supply and the cell power supply, the row decoder unit of the SRAM requires a level shifter.

The level shifter includes, e.g., a PMOS transistor for pull-up to the cell power supply voltage and an NMOS transistor for pull-down to ground voltage. In the level shifter, the current drivability of the pull-up PMOS transistor needs to be much lower than that of the pull-down NMOS transistor for stable operation. This greatly changes the operation speed between a selected mode and a deselected mode of a word line. Hence, the operation speed of the whole SRAM decreases.

BRIEF SUMMARY OF THE INVENTION

According to a first aspect of the present invention, there is provided a memory device which operates using a first power supply and a second power supply, comprising:

a static memory cell which receives the first power supply;

a word line which is connected to the memory cell; and a decoder which controls selection/deselection of the word line on the basis of an address signal having a voltage of the second power supply, the decoder including:

a level shifter which changes a voltage of the word line to a voltage of the first power supply; and a switching circuit which receives the first power supply and applies a voltage lower than the first power supply to the level shifter in selecting the word line.

According to a second aspect of the present invention, there is provided a memory device which operates using a first power supply and a second power supply, comprising:

a plurality of memory cells which receive the first power supply;

a plurality of word lines which are connected to the plurality of memory cells, respectively;

a plurality of decoders which control selection/deselection of the word lines on the basis of an address signal having a voltage of the second power supply, each of the decoders including a level shifter which changes a voltage of a word line corresponding to the decoder to a voltage of the first power supply; and a switching circuit which receives the first power supply, is connected to the level shifter via a common line, and applies a voltage lower than the first power supply to the level shifter in selecting the word line.

BRIEF DESCRIPTION OF THE SEVERAL VIEWS OF THE DRAWING

FIG. 1 is a block diagram illustrating the arrangement of an SRAM according to the first embodiment of the present invention;

FIG. 2 is a circuit diagram illustrating the arrangement of a memory cell MC shown in FIG. 1;

FIG. 3 is a circuit diagram illustrating the arrangement of a row decoder 15 shown in FIG. 1;

DETAILED DESCRIPTION OF THE INVENTION

Figure 4:
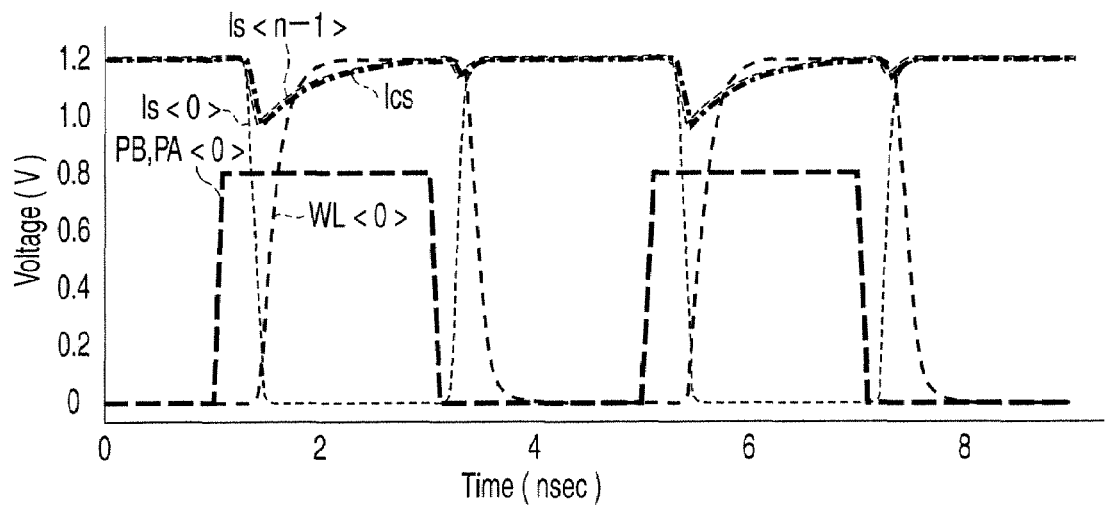
FIG. 4 is a timing chart illustrating the operation waveforms of the row decoder 15.

Embodiments of the present invention will be explained below with reference to the accompanying drawing. Note that in the following explanation, the same reference numbers denote elements having the same functions and arrangements, and a repetitive explanation will be made only when necessary.

First Embodiment

FIG. 1 is a block diagram illustrating the arrangement of an SRAM according to the first embodiment of the present invention. The SRAM comprises a memory cell array 11 including a plurality of static memory cells MC. The memory cell array 11 has a plurality of word lines WL running in the row direction. The memory cell array 11 has a plurality of pairs of bit lines BL and /BL running in the column direction.

The word lines WL select rows in the memory cell array 11. The pairs of bit lines BL and /BL select columns in the memory cell array 11.

A column decoder 12 is connected to the plurality of pairs of bit lines BL and /BL. The column decoder 12 decodes a column address signal supplied from a controller 16 and selects a corresponding pair of bit lines BL and /BL.

A write/read circuit 13 is connected to the column decoder 12. The write/read circuit 13 writes data to or reads it from a column selected by the column decoder 12. More specifically, the write/read circuit 13 writes input data DI from an external circuit to the memory cell array 11 as write data. The write/read circuit 13 also reads data from the memory cell array 11 and outputs the read data to an external circuit 4 as output data DO.

A precharge circuit 14 precharges all pairs of bit lines BL and /BL to a high-level voltage before read and write operations are executed. For example, the precharge circuit 14 executes the precharge operation on the basis of a precharge signal supplied from the controller 16. That is, the precharge circuit 14 precharges the pairs of bit lines BL and /BL to the high-level voltage when the precharge signal is asserted, and cancels precharging when the precharge signal is negated.

A row decoder 15 is connected to the plurality of word lines WL. The row decoder 15 decodes a row address signal supplied from the controller 16 and selects a corresponding word line WL. The detailed arrangement of the row decoder 15 will be described later.

The controller 16 controls the circuits in the SRAM. The controller 16 receives an address signal ADD, a control signal CNT, and the like from an external circuit. On the basis of the address signal ADD, the controller 16 generates the column address signal to be supplied to the column decoder 12. The controller 16 also controls the precharge operation, write operation, and read operation based on, e.g., the control signal CNT.

The controller 16 includes a predecoder 16A. On the basis of the address signal ADD, the predecoder 16A generates the row address signal to be supplied to the row decoder 15. The row address signal includes an upper row address signal PB and lower row address signal PA.

FIG. 2 is a circuit diagram illustrating the arrangement of the memory cell MC shown in FIG. 1. The memory cell MC includes a first inverter INV1 and second inverter INV2. The first inverter INV1 comprises a p-channel MOS (PMOS) transistor LD1 as a load and an n-channel MOS (NMOS) transistor DV1 for driving. PMOS transistor LD1 and NMOS transistor DV1 are connected in series between a cell power supply terminal that receives a cell power supply voltage VDDC and a ground terminal that receives ground voltage VSS.

The second inverter INV2 comprises a PMOS transistor LD2 as a load and an NMOS transistor DV2 for driving. PMOS transistor LD2 and NMOS transistor DV2 are connected in series between the cell power supply terminal and ground terminal.

More specifically, the source terminal of PMOS transistor LD1 is connected to the cell power supply terminal. The drain terminal of PMOS transistor LD1 is connected to the drain terminal of NMOS transistor DV1 via a memory node N1. The gate terminal of PMOS transistor LD1 is connected to the gate terminal of NMOS transistor DV1. The source terminal of NMOS transistor DV1 is connected to the ground terminal.

The source terminal of PMOS transistor LD2 is connected to the cell power supply terminal. The drain terminal of PMOS transistor LD2 is connected to the drain terminal of NMOS transistor DV2 via a memory node N2. The gate terminal of PMOS transistor LD2 is connected to the gate terminal of NMOS transistor DV2. The source terminal of NMOS transistor DV2 is connected to the ground terminal.

The gate terminal of PMOS transistor LD1 is connected to memory node N2. The gate terminal of PMOS transistor LD2 is connected to memory node N1. In other words, the first inverter INV1 and second inverter INV2 are cross-coupled. More specifically, the output terminal of the first inverter INV1 is connected to the input terminal of the second inverter INV2, and the output terminal of the second inverter INV2 is connected to the input terminal of the first inverter INV1.

Memory node N1 is connected to the bit line BL via a transfer gate XF1 that is an NMOS transistor. The gate terminal of the transfer gate XF1 is connected to the word line WL.

Memory node N2 is connected to the bit line /BL via a transfer gate XF2 that is an NMOS transistor. The gate terminal of the transfer gate XF2 is connected to the word line WL. The memory cell MC is thus formed.

The SRAM operates using two power supply voltages: the cell power supply voltage VDDC and logic power supply voltage VDDL. The cell power supply voltage VDDC and logic power supply voltage VDDL are applied from, e.g., a circuit external to the SRAM. The cell power supply voltage VDDC is applied to the memory cell array 11 and part (the circuit that directly drives the word line WL) of the row decoder 15. The logic power supply voltage VDDL is applied to the remaining peripheral circuits.

The logic power supply voltage VDDL is a variable voltage. In accordance with the operation mode, that is controlled by a processor, of the SRAM, the logic power supply voltage VDDL is set to a voltage necessary for the SRAM to operate at a speed required for the operation mode. For example, the logic power supply voltage VDDL is set to about 1.2V in an operation mode requiring the high-speed operation of the SRAM. In an operation mode that allows an operation at a relatively low speed, the logic power supply voltage VDDL is set to about 0.8V.

For the memory cell MC, the power supply voltage cannot be reduced because of the necessity of ensuring stability in holding data. It is also impossible to greatly reduce the word line potential from the viewpoint of ensuring the cell current or the write margin of the memory cell. Due to these reasons, the cell power supply voltage VDDC fixed at a high voltage is applied to the memory cells MC and part of the row decoder 15. The cell power supply voltage VDDC is fixed at about 1.2V.

In this way, a high power supply voltage is used for only the cell power supply voltage VDDC to be applied to the memory cells MC and the like, while only the logic power supply voltage VDDL is dynamically changed in accordance with the operation mode. This makes it possible to reduce the power consumption of the SRAM as compared to an SRAM which operates using a high power supply voltage in all operation modes.

The detailed arrangement of the row decoder 15 will be described next. As described above, since the memory cells MC and peripheral circuits use different operating (power supply) voltages, a potential difference is produced between the logic power supply voltage VDDL and the cell power supply voltage VDDC in the row decoder 15. Hence, the row decoder 15 has a level shifter.

FIG. 3 is a circuit diagram illustrating the arrangement of the row decoder 15 shown in FIG. 1. The row decoder 15 includes a plurality of blocks. FIG. 3 shows a block extracted from the plurality of blocks.

The row decoder 15 comprises a plurality of row decoders 15<0> to 15<n−1> corresponding to a plurality of word lines WL<0> to Wl<n−1>. Each of the row decoders 15<0> to 15<n−1> includes a NAND gate NA1, inverter IV2, and level shifter 15A which shifts the voltage level. The level shifter 15A includes two pull-up PMOS transistors PC1 and PC2, two pull-down NMOS transistors NC1 and NC2, and an inverter IV1. The logic power supply voltage VDDL is applied to the power supply terminals of the NAND gate NA1 and inverter IV1. The cell power supply voltage VDDC is applied to the power supply terminal of inverter IV2.

The upper row address signal PB is input to one input terminal of the NAND gate NA1. The lower row address signal PA<0> is applied to the other input terminal of the NAND gate NA1. The upper row address signal PB is a row address signal to select one block. The lower row address signal PA is a row address signal to select one word line WL in one block. Hence, one of all word lines connected to the plurality of blocks can be selected in accordance with the combination of the upper row address signal PB and lower row address signal PA.

The output terminal of the NAND gate NA1 is connected to the gate terminal of NMOS transistor NC2. The source terminal of NMOS transistor NC2 is connected to the ground terminal VSS. The drain terminal of NMOS transistor NC2 is connected to the drain terminal of PMOS transistor PC2. The source terminal of PMOS transistor PC2 is connected to the cell power supply terminal VDDC.

The output terminal of the NAND gate NA1 is also connected to the input terminal of inverter IV1. The output terminal of inverter IV1 is connected to the gate terminal of NMOS transistor NC1. The source terminal of NMOS transistor NC1 is connected to the ground terminal VSS. The drain terminal of NMOS transistor NC1 is connected to the drain terminal of PMOS transistor PC1. The source terminal of PMOS transistor PC1 is connected to a common source line lcs.

PMOS transistors PC1 and PC2 are cross-coupled. More specifically, the gate terminal of PMOS transistor PC1 is connected to the drain terminal of PMOS transistor PC2. The gate terminal of PMOS transistor PC2 is connected to the drain terminal of PMOS transistor PC1.

The drain terminal of NMOS transistor NC1 is connected to the input terminal of inverter IV2 via a node is. The output terminal of inverter IV2 is connected to the word line WL.

A switching circuit 15B is connected to the common source line lcs. One switching circuit 15B is provided in correspondence with one block. The switching circuit 15B includes two PMOS transistors PS1 and PS2 serving as switching elements. The drain terminals of PMOS transistors PS1 and PS2 are connected to the common source line lcs. The source terminals of PMOS transistors PS1 and PS2 are connected to the cell power supply terminal VDDC. The upper row address signal PB is input to the gate terminal of PMOS transistor PS1. The gate terminal of PMOS transistor PS2 is connected to the ground terminal VSS.

The current drivability of PMOS transistor PS2 is set to be much lower than that of PMOS transistor PS1. In a normal level shifter, the current drivability of the pull-down NMOS transistor on the ground side is set to be higher than that of the pull-up PMOS transistor for a normal level shift operation. In this embodiment, however, without this restriction, the current drivability ratio (βPC1/βNC1) between the pull-up PMOS transistor PC1 and the pull-down NMOS transistor NC1 is set to about 1 or more. Similarly, the current drivability ratio (βPC2/βNC2) between the pull-up PMOS transistor PC2 and the pull-down NMOS transistor NC2 is set to about 1 or more.

The operation of the SRAM having the above arrangement will be described. FIG. 4 is a timing chart illustrating the operation waveforms of the row decoder 15.

In selecting a word line, the upper row address signal PB corresponding to the selected block changes to high level (a voltage equal to the logic power supply voltage VDDL). One of the lower row address signals PA<0> to PA<n−1> changes to high level (a voltage equal to the logic power supply voltage VDDL), and one of the n word lines WL<0> to WL<n−1> that share the upper row address signal PB changes to high level. FIG. 4 and the following explanation exemplify the word line WL<0> as the selected word line.

When the upper row address signal PB changes to high level, the gate-to-source voltage of PMOS transistor PS1 decreases, and the current drivability of PMOS transistor PS1 reduces. Hence, the voltage level of the common source line lcs becomes less than the cell power supply voltage VDDC.

When the upper row address signal PB and lower row address signal PA<0> change to high level, the gate terminal of the pull-down NMOS transistor NC1 is set at high level. Hence, NMOS transistor NC1 is turned on.

The gate terminal of PMOS transistor PS1 is fixed at high level earlier than the gate terminal of NMOS transistor NC1. For this reason, when NMOS transistor NC1 is turned on, the voltage level of the common source line lcs quickly lowers. Since the gate-to-source voltage of the pull-up PMOS transistor PC1 decreases, the pull-up strength of PMOS transistor PC1 decreases. It is therefore possible to execute the pull-down operation by NMOS transistor NC1 and the selection operation of the word line WL<0> at a high speed.

FIG. 4 shows operation waveforms when the logic power supply voltage VDDL is lower (0.8V) than the cell power supply voltage VDDC (1.2V). When the logic power supply voltage VDDL equals the cell power supply voltage VDDC (i.e., both voltages are 1.2V), PMOS transistor PS1 is turned off. However, since PMOS transistor PS2 is normally on, the common source line lcs never floats.

As described above, the current drivability of PMOS transistor PS2 is set to be much lower than that of PMOS transistor PS1. Hence, in selecting the word line WL<0>, the voltage level of the common source line lcs is set to be lower than the cell power supply voltage VDDC. This enables high-speed selection of the word line WL<0> even when the logic power supply voltage VDDL equals the cell power supply voltage VDDC.

In deselecting the word line WL<0>, both the upper row address signal PB and the lower row address signal PA<0> change to low level. When the upper row address signal PB changes to low level, the gate-to-source voltage of PMOS transistor PS1 increases, and the current drivability of PMOS transistor PS1 increases. Hence, the level of the common source line lcs is set to be almost equal to the cell power supply voltage VDDC.

The pull-up PMOS transistor PC1 is turned on, and the pull-down NMOS transistor NC1 is turned off. It is therefore possible to execute the pull-up operation by PMOS transistor PC1 and the deselection operation of the word line WL<0> at a high speed.

Figure 5:
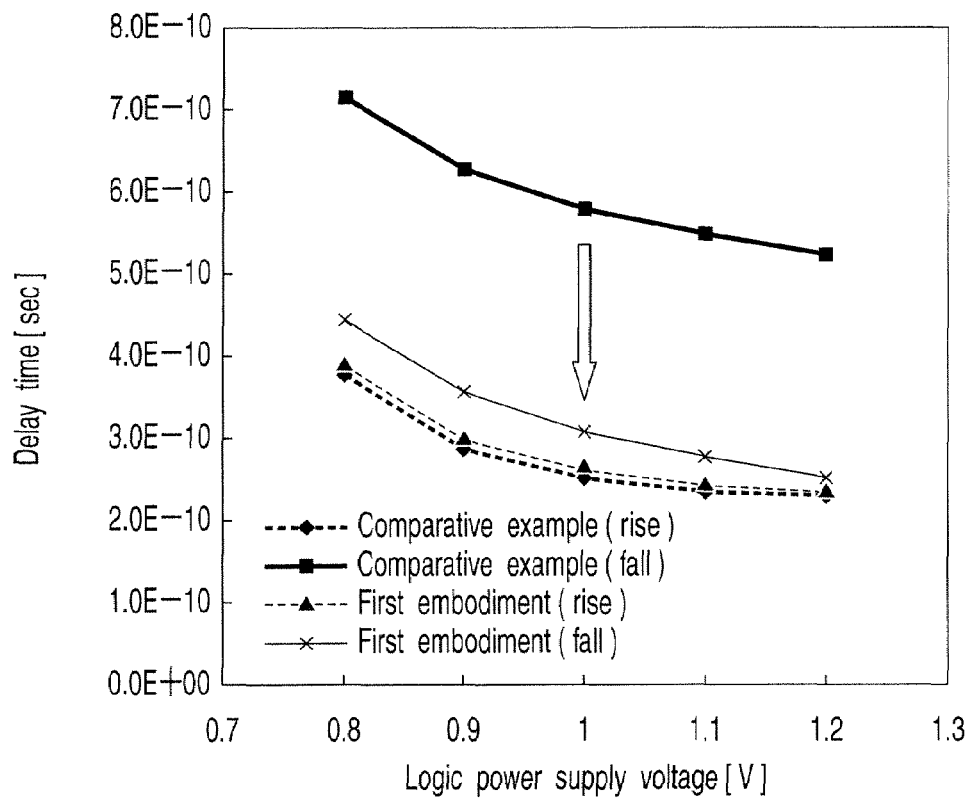
FIG. 5 is a graph illustrating the delay time between the selection operation and the deselection operation of a word line in each of the row decoder 15 of this embodiment and a row decoder of a comparative example.

FIG. 5 is a graph illustrating the delay time between the selection operation (rise) and the deselection operation (fall) of a word line in each of the row decoder 15 of this embodiment and a row decoder of a comparative example. In the row decoder of the comparative example, the source terminal of PMOS transistor PC1 is connected to the cell power supply terminal directly without introducing an intervening switching circuit. Additionally, the current drivability of NMOS transistor NC1 is set to be much higher than that of PMOS transistor PC1.

As shown in FIG. 5, in the row decoder of the comparative example, the deselection operation of the word line is considerably slower than the selection operation. On the other hand, in the row decoder 15 of this embodiment, the delay in the deselection operation is similar to that in the selection operation. Hence, the entire SRAM can operate at a high speed.

In the row decoder 15 of this embodiment, when, e.g., eight rows share the switching circuit 15B (PMOS transistors PS1 and PS2) (n=8), the increase in the number of elements can be suppressed to about 2% as compared to the arrangement of the comparative example. That is, even when the embodiment is applied to an SRAM, the increase in the area can be minimized.

Second Embodiment

The row decoder of the first embodiment lowers the level of the common source line lcs to reduce the pull-up strength of PMOS transistor PC1 in selecting a word line, as indicated by the operation waveforms in FIG. 4. Of the row decoders that share the common source line lcs, those corresponding to deselected word lines temporarily decrease even the output level of the level shifter 15A due to the decrease in the level of the common source line lcs.

If the output level of the level shifter 15A decreases greatly, a deselected word line may be selected erroneously, or the through current of the level shifter may increase. The second embodiment avoids such operations.

Figure 6:
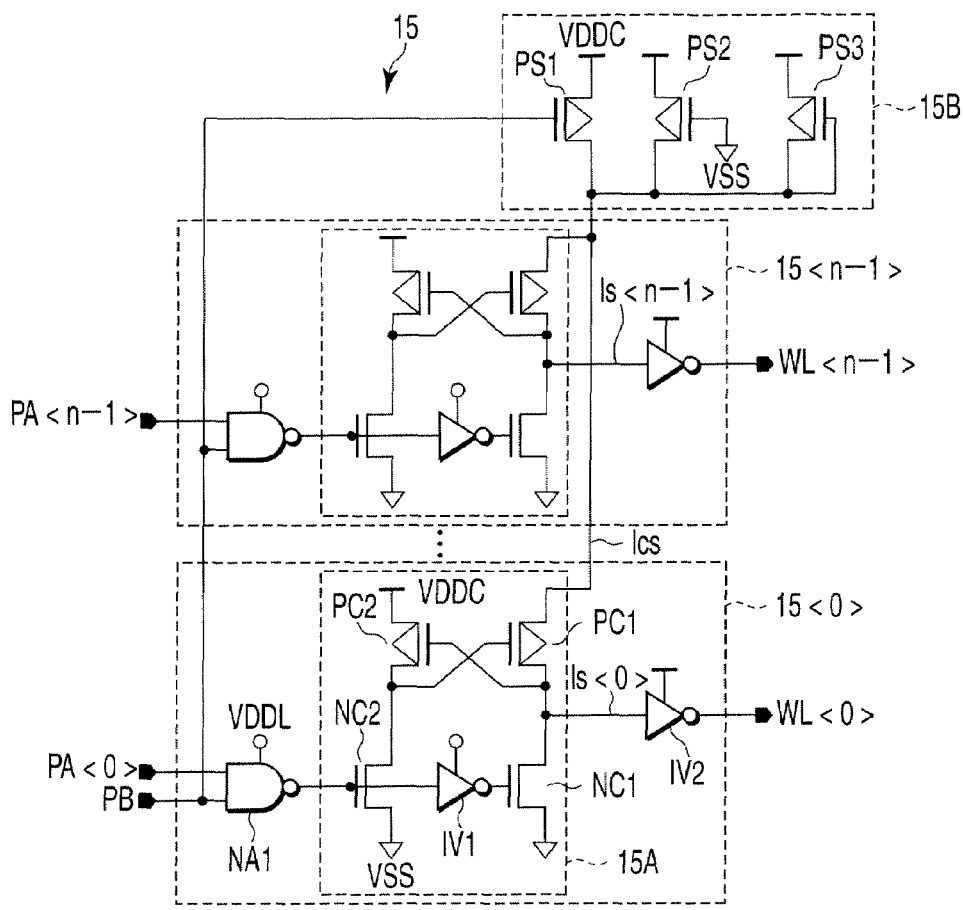
FIG. 6 is a circuit diagram illustrating the arrangement of a row decoder 15 according to the second embodiment of the present invention.

FIG. 6 is a circuit diagram illustrating the arrangement of a row decoder 15 according to the second embodiment of the present invention. A switching circuit 15B further comprises a diode-connected PMOS transistor PS3 for level clamping. The remaining components are the same as in the row decoder 15 of the first embodiment.

The gate terminal of PMOS transistor PS3 is connected to the drain terminal of its own. The drain terminal of PMOS transistor PS3 is connected to a common source line lcs. The source terminal of PMOS transistor PS3 is connected to a cell power supply terminal VDDC.

PMOS transistor PS3 is turned on when the level of the common source line lcs drops from the cell power supply voltage VDDC by almost the same amount as the threshold voltage of PMOS transistor PS3. Hence, the level of the common source line lcs is clamped to a voltage obtained by subtracting the threshold voltage of PMOS transistor PS3 from the cell power supply voltage VDDC. This prevents the level of the common source line lcs from becoming too low. It is therefore possible to prevent operation error of a deselected word line or the through current of the level shifter.

Third Embodiment

Figure 7:
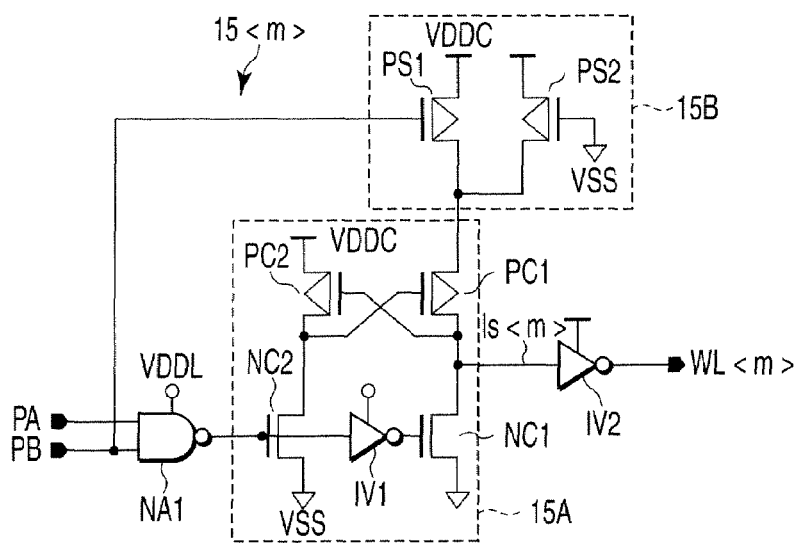
FIG. 7 is a circuit diagram illustrating the arrangement of a row decoder 15 according to the third embodiment of the present invention.

In the row decoder of the first embodiment, a plurality of rows included in one block share the switching circuit 15B. The switching circuit 15B may be provided for each row (each word line). FIG. 7 is a circuit diagram illustrating the arrangement of a row decoder 15 according to the third embodiment of the present invention. In this embodiment, a level shifter 15A and switching circuit 15B are provided in correspondence with each word line WL. FIG. 7 shows a row decoder 15<m> connected to a word line WL<m>. Actually, the row decoder 15 includes row decoders 15<m> shown in FIG. 7 in correspondence with all word lines.

The word line WL<m> is selected when both an upper row address signal PB and a lower row address signal PA change to high level. The operations of the level shifter 15A and switching circuit 15B at this time are the same as in the first embodiment.

On the other hand, when both the upper row address signal PB and the lower row address signal PA change to low level, the word line WL<m> is deselected. The operations of the level shifter 15A and switching circuit 15B at this time are the same as in the first embodiment. The selection and deselection operations of the word line WL can be done at a high speed even in the row decoder with the above arrangement.

In this embodiment, the switching circuit 15B is provided for each word line. The decrease in the level of a common source line lcs does not influence other word lines, unlike the first embodiment. Hence, PMOS transistor PS3 for level clamping is unnecessary. The gate of a PMOS transistor PS1 can be controlled by either of the upper row address signal PB and lower row address signal PA.

Figure 8:
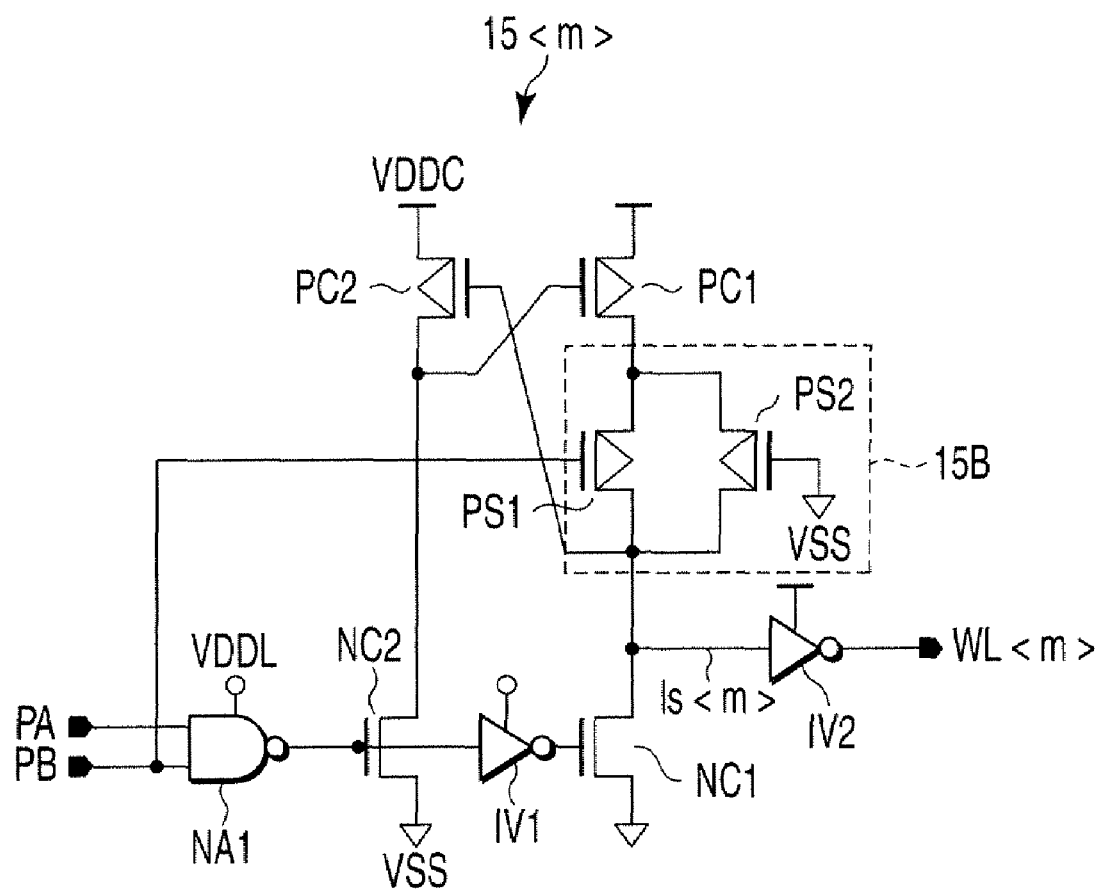
FIG. 8 is a circuit diagram illustrating another example of the row decoder 15 according to the third embodiment.

The switching circuit 15B corresponding to each word line may be inserted to the drain terminal side of a pull-up PMOS transistor PC1. FIG. 8 is a circuit diagram illustrating another example of the row decoder 15 according to the third embodiment.

The source terminal of the pull-up PMOS transistor PC1 included in the level shifter 15A is connected to the cell power supply terminal VDDC. The source terminals of PMOS transistors PS1 and PS2 included in the switching circuit 15B are connected to the drain terminal of the pull-up PMOS transistor PC1. The drain terminals of PMOS transistors PS1 and PS2 are connected to a node ls<m>.

The row decoder 15 with the arrangement shown in FIG. 8 can also provide the same effect as the row decoder 15 shown in FIG. 7.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device which operates using a first power supply and a second power supply, comprising:
    a static memory cell which receives the first power supply;
    a word line which is connected to the memory cell; and
    a decoder which controls selection/deselection of the word line on the basis of an address signal set to a voltage of the second power supply in selecting the word line and set to ground voltage in deselecting the word line,
    the decoder including,
        a level shifter which changes a voltage of the word line to a voltage of the first power supply; and
        a switching circuit which applies a voltage lower than the first power supply to the level shifter in selecting the word line, the switching circuit including a first p-type transistor having a source terminal which receives the first power supply, a drain terminal connected to the level shifter, and a gate terminal which receives the address signal.

2. The device according to claim 1 wherein the switching circuit includes a second p-type transistor having a source terminal which receives the first power supply, a drain terminal connected to the level shifter, and a grounded gate terminal.

3. The device according to claim 2, wherein a current drivability of the second p-type transistor is lower than that of the first p-type transistor.

4. The device according to claim 1, wherein the level shifter sets a node connected to the word line via an inverter to ground voltage in selecting the word line and sets the node to the voltage of the first power supply in deselecting the word line.

5. The device according to claim 4, wherein the level shifter includes an n-type transistor which drops the node to ground voltage in selecting the word line, and a third p-type transistor which raises the node to the voltage of the first power supply in deselecting the word line.

6. The device according to claim 5, wherein
the third p-type transistor includes a source terminal connected to the switching circuit, a gate terminal to be set to the voltage of the first power supply in selecting the word line and to be set to ground voltage in deselecting the word line, and a drain terminal connected to the node, and
the n-type transistor includes a drain terminal connected to the node, a gate terminal which receives the address signal, and a grounded source terminal.

7. The device according to claim 5, wherein a ratio of a current drivability of the third p-type transistor to the n-type transistor is not less than 1.

8. The device according to claim 1, wherein the second power supply is not more than the first power supply.

9. The device according to claim 1, wherein the memory cell includes:
a first inverter and a second inverter;
a first memory node which is connected to an output of the first inverter and an input of the second inverter; and
a second memory node which is connected to an input of the first inverter and an output of the second inverter, and
each of the first inverter and the second inverter includes,
a load transistor including a source terminal which receives the first power supply; and
a driving transistor including a drain terminal connected to a drain terminal of the load transistor via a memory node, a gate terminal connected to a gate terminal of the load transistor, and a grounded source terminal.

10. A semiconductor memory which operates using a first power supply and a second power supply, comprising:
a plurality of memory cells which receive the first power supply;
a plurality of word lines which are connected to the plurality of memory cells, respectively;
a plurality of decoders which control selection/deselection of the word lines on the basis of an address signal, each of the decoders including a level shifter which changes a voltage of a word line corresponding to the decoder to a voltage of the first power supply, the address signal being set to a voltage of the second power supply in selecting the word line and set to ground voltage in deselecting the word line; and
a switching circuit which is connected to the level shifter via a common line, and applies a voltage lower than the first power supply to the level shifter in selecting the word line, the switching circuit including a first p-type transistor having a source terminal which receives the first power supply, a drain terminal connected to the common line, and a gate terminal which receives the address signal.

11. The device according to claim 10, wherein the switching circuit includes a second p-type transistor having a source terminal which receives the first power supply, a drain terminal connected to the common line, and a grounded gate terminal.

12. The device according to claim 11, wherein a current drivability of the second p-type transistor is lower than that of the first p-type transistor.

13. The device according to claim 10, wherein the switching circuit includes a third p-type transistor having a source terminal which receives the first power supply, and a gate terminal and a source terminal which are connected to the common line.

14. The device according to claim 10, wherein the level shifter sets a node connected to the word line via an inverter to ground voltage in selecting the word line and sets the node to the voltage of the first power supply in deselecting the word line.

15. The device according to claim 14, wherein the level shifter includes an n-type transistor which drops the node to ground voltage in selecting the word line, and a fourth p-type transistor which raises the node to the voltage of the first power supply in deselecting the word line.

16. The device according to claim 15, wherein
the fourth p-type transistor includes a source terminal connected to the common line, a gate terminal to be set to the voltage of the first power supply in selecting the word line and to be set to ground voltage in deselecting the word line, and a drain terminal connected to the node, and
the n-type transistor includes a drain terminal connected to the node, a gate terminal which receives the address signal, and a grounded source terminal.

17. The device according to claim 16, wherein a ratio of a current drivability of the fourth p-type transistor to the n-type transistor is not less than 1.

18. The device according to claim 10, wherein the second power supply is not more than the first power supply.

* * * * *